(12) United States Patent
Gamerith et al.

(10) Patent No.: US 8,823,084 B2
(45) Date of Patent: Sep. 2, 2014

(54) SEMICONDUCTOR DEVICE WITH CHARGE COMPENSATION STRUCTURE ARRANGEMENT FOR OPTIMIZED ON-STATE RESISTANCE AND SWITCHING LOSSES

(71) Applicant: Infineon Technologies Austria AG, Villach (AT)

(72) Inventors: Stefan Gamerith, Villach (AT); Hans Weber, Bayerisch Gmain (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/731,484

(22) Filed: Dec. 31, 2012

(65) Prior Publication Data

US 2014/0183621 A1    Jul. 3, 2014

(51) Int. Cl.
- *H01L 29/78* (2006.01)
- *H01L 29/66* (2006.01)
- *H01L 29/739* (2006.01)

(52) U.S. Cl.
CPC .... *H01L 29/66325* (2013.01); *H01L 29/66333* (2013.01); *H01L 29/7393* (2013.01)
USPC ........................................................ 257/329

(58) Field of Classification Search
CPC .................. H01L 29/66325; H01L 29/66333; H01L 29/7393; H01L 29/7395
USPC .......................................... 257/329, 242, 488
See application file for complete search history.

(56) References Cited

U.S. PATENT DOCUMENTS

| | | | |
|---|---|---|---|
| 5,216,275 A | 6/1993 | Chen | |
| 6,551,909 B1 * | 4/2003 | Fujihira | 438/510 |
| 6,630,698 B1 | 10/2003 | Deboy et al. | |

(Continued)

FOREIGN PATENT DOCUMENTS

| | | |
|---|---|---|
| DE | 102005047056 B3 | 1/2007 |
| DE | 102005041322 A1 | 3/2007 |
| DE | 102007018631 B4 | 1/2009 |

OTHER PUBLICATIONS

Hans Weber et al. "Charge Compensation Semiconductor Device." U.S. Appl. No. 13/414,037, filed Mar. 7, 2012.

(Continued)

*Primary Examiner* — Nathan Ha
(74) *Attorney, Agent, or Firm* — Murphy, Bilak & Homiller, PLLC

(57) ABSTRACT

A semiconductor device has a source metallization, drain metallization, and semiconductor body. The semiconductor body includes a drift layer of a first conductivity contacted with the drain metallization, a buffer (and field-stop) layer of the first conductivity higher in maximum doping concentration than the drift layer, and a plurality of compensation regions of a second conductivity, each forming a pn-junction with the drift and buffer layers and in contact with the source metallization. Each compensation region includes a first portion between a second portion and the source metallization. The first portions and the drift layer form a first area having a vanishing net doping. The second portions and the buffer layer form a second area of the first conductivity. A space charge region forms in the second area when a reverse voltage of more than 30% of the device breakdown voltage is applied between the drain and source metallizations.

25 Claims, 4 Drawing Sheets

(56) References Cited

U.S. PATENT DOCUMENTS

| | | | |
|---|---|---|---|
| 6,683,347 B1 * | 1/2004 | Fujihira | 257/341 |
| 6,724,042 B2 * | 4/2004 | Onishi et al. | 257/341 |
| 6,734,520 B2 | 5/2004 | Kapels et al. | |
| 6,819,089 B2 | 11/2004 | Deboy et al. | |
| 6,831,338 B1 | 12/2004 | Roy | |
| 6,936,892 B2 * | 8/2005 | Fujihira | 257/341 |
| 7,253,476 B2 * | 8/2007 | Fujihira | 257/341 |
| 7,646,061 B2 | 1/2010 | Hirler | |
| 7,750,397 B2 | 7/2010 | Hirler et al. | |
| 7,781,842 B2 | 8/2010 | Hirler et al. | |
| 7,875,951 B2 | 1/2011 | Rieger et al. | |
| 8,168,480 B2 * | 5/2012 | Lin et al. | 438/140 |
| 2002/0096708 A1 | 7/2002 | Ahlers et al. | |
| 2005/0042830 A1 * | 2/2005 | Blanchard | 438/268 |
| 2005/0045922 A1 | 3/2005 | Ahlers et al. | |
| 2005/0082591 A1 | 4/2005 | Hirler et al. | |
| 2007/0085136 A1 | 4/2007 | Krumrey et al. | |
| 2007/0126056 A1 | 6/2007 | Hirler | |
| 2007/0138544 A1 | 6/2007 | Hirler et al. | |
| 2008/0265329 A1 | 10/2008 | Hirler et al. | |
| 2009/0267174 A1 * | 10/2009 | Willmeroth et al. | 257/493 |
| 2010/0078775 A1 * | 4/2010 | Mauder et al. | 257/655 |
| 2010/0276729 A1 | 11/2010 | Aoi et al. | |
| 2010/0301386 A1 * | 12/2010 | Lin et al. | 257/140 |
| 2012/0001224 A1 * | 1/2012 | Patti et al. | 257/139 |
| 2012/0088353 A1 * | 4/2012 | Willmeroth et al. | 438/460 |

OTHER PUBLICATIONS

Hans Weber et al. "Charge Compensation Semiconductor Device." U.S. Appl. No. 13/541,884, filed Jul. 5, 2012.

* cited by examiner

US 8,823,084 B2

SEMICONDUCTOR DEVICE WITH CHARGE COMPENSATION STRUCTURE ARRANGEMENT FOR OPTIMIZED ON-STATE RESISTANCE AND SWITCHING LOSSES

TECHNICAL FIELD

Embodiments of the present invention relate to semiconductor devices having charge compensation structures, in particular to power semiconductor transistors having charge compensation structures.

BACKGROUND

Semiconductor transistors, in particular field-effect controlled switching devices such as a Metal Oxide Semiconductor Field Effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low on-state resistance Ron and high breakdown voltages $U_{bd}$ are often desired.

For this purpose charge compensation semiconductor devices were developed. The compensation principle is based on a mutual compensation of charges in n- and p-doped zones in the drift region of a MOSFET.

Typically, the charge compensation structure formed by p-type and n-type zones, for example p-type and n-type columns, is for vertical charge compensation MOSFETs arranged below the actual MOSFET-structure with source regions, body regions and gate regions, and also below the associated MOS-channels. The p-type and n-type zones are arranged next to one another in the semiconductor volume of the semiconductor device or interleaved in one another in such a way that, in the off-state, their charges can be mutually depleted and that, in the activated state or on-state, there results an uninterrupted, low-impedance conduction path from a source electrode near the surface to a drain electrode which may be arranged on the back side.

By virtue of the compensation of the p-type and n-type dopants, the doping of the current-carrying region can be significantly increased in the case of compensation components (compared to structures with the same breakdown voltage but without compensation structures) which results in a significant reduction of the on-state resistance Ron despite the loss of a current-carrying area. The reduction of the on-state resistance Ron of such semiconductor power devices is associated with a reduction of the heat loss, so that such semiconductor power devices with charge compensation structure remain "cool" compared with conventional semiconductor power devices.

The lowest on-state resistance Ron would be achieved if the charge compensation structures extend to a highly doped semiconductor substrate. However, a direct transition between highly doped semiconductor substrate and a conventional charge compensation region increases the risk of device failure for the following reasons. Due to an abrupt bending of the output capacitance, fast switching may in turn produce an extremely high change of voltage (dV/dt) resulting in destruction of the semiconductor device. During commutating the body diode, a very abrupt current break may occur when the charge carrier plasma is depleted (lack of "softness" of the body diode), which in turn may lead to oscillations and even to the destruction of the semiconductor device. Furthermore, in case of an avalanche event that may be triggered by cosmic radiation or an external inductive load, the electric field may highly be increased in a transition zone between the highly doped semiconductor substrate and the charge compensation region. This may result in generating even more charge carriers which, possibly in combination with the ignition of a parasitic bipolar transistor formed between the source region, the body region, and the drain region, may also damage the semiconductor device.

Accordingly, there is a need to improve the trade-off between on-state resistance Ron and of reliability of charge compensation structures.

SUMMARY

According to an embodiment of a semiconductor device having a breakdown voltage includes a source metallization, a drain metallization and a semiconductor body. The semiconductor body includes a drift layer of a first conductivity type in Ohmic contact with the drain metallization and a buffer and field-stop layer of the first conductivity type adjoining the drift layer and having a higher maximum doping concentration than the drift layer. The semiconductor body further includes in a vertical cross-section a plurality of spaced apart compensation regions of a second conductivity type each of which forms a respective first pn-junction with the drift layer and the buffer and field-stop layer and is in Ohmic contact with the source metallization. Each of the compensation regions includes a second portion and a first portion arranged between the second portion and the source metallization. The first portions and the drift layer form a substantially band-shaped first area having a substantially vanishing net doping. The second portions and at least the buffer and field-stop layer form a substantially band-shaped second area having a net doping of the first conductivity type. A space charge region forms in the second area when a reverse voltage between about 30% and at least 70% of the breakdown voltage is applied between the drain metallization and the source metallization.

According to an embodiment of a semiconductor device having a breakdown voltage, the semiconductor device includes a source metallization, a drain metallization and a semiconductor body. The semiconductor body includes a drift layer of a first conductivity type in Ohmic contact with the drain metallization and field-stop layer of the first conductivity type arranged between the drain metallization and the drift layer, in ohmic contact with the drift layer and having a higher maximum doping concentration than the drift layer. The semiconductor body further includes in a vertical cross-section at least two spaced apart compensation regions of a second conductivity type each of which forms a respective first pn-junction with the drift layer and is in Ohmic contact with the source metallization, and in the vertical cross section at least two floating compensation regions of the second conductivity type each of which forms a closed pn-junction with the field-stop layer and is arranged in a portion of the field-stop layer which is not depleted when the breakdown voltage is applied between the drain metallization and the source metallization.

According to an embodiment of a semiconductor device having a breakdown voltage, the semiconductor device includes a source metallization, a drain metallization and a semiconductor body. The semiconductor body includes a main surface, a drift layer of a first conductivity type in Ohmic contact with the drain metallization, a buffer and field-stop layer of the first conductivity type adjoining the drift layer and having a higher maximum doping concentration than the drift layer, and a plurality of unit cells. In a vertical cross-section which is substantially orthogonal to the main surface, the plurality of unit cells includes a plurality of spaced apart compensation regions of a second conductivity type each of which forms a respective first pn-junction with the drift layer and the buffer and field-stop layer and is in Ohmic contact with the source metallization. An upper portion of the unit cells having a substantially vanishing net doping and an adjoining lower portion of the unit cells having a net doping of the first conductivity type is provided. A space charge region is forms in the lower portion when a reverse voltage between about 30% and at least 70% of the breakdown voltage is applied between the drain metallization and the source metallization. In an avalanche mode, a penetration depth of an electric field into the buffer and field-stop layer increases with the current.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding. In the drawings.

DETAILED DESCRIPTION

Figure 1:
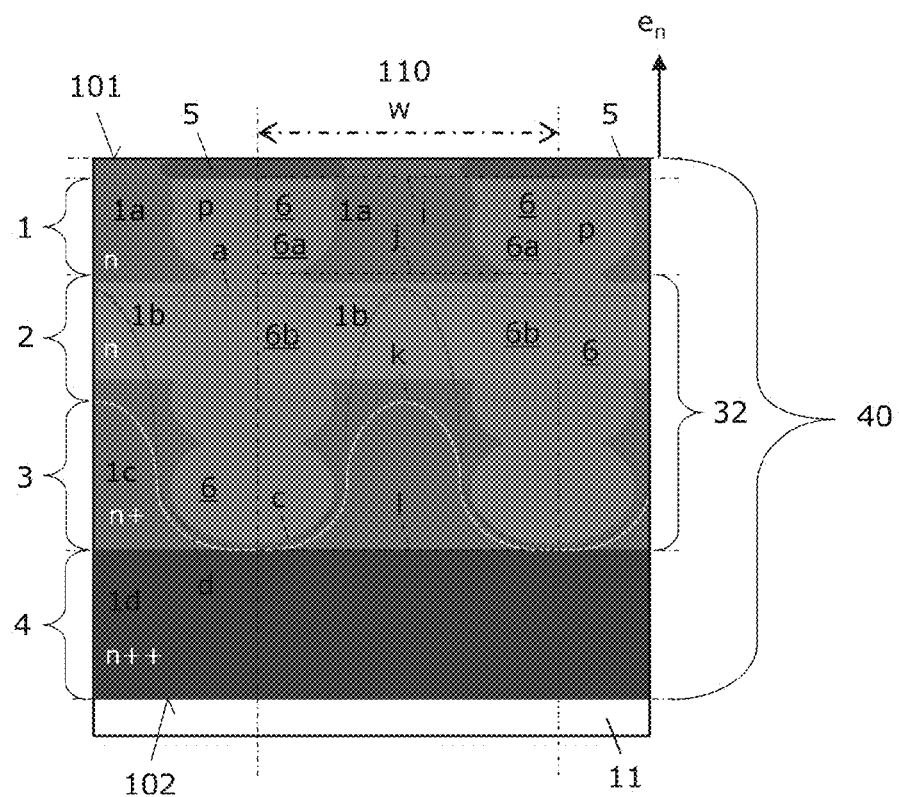
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to a first surface, i.e. parallel to the normal direction of the first surface of the semiconductor substrate or body.

In this specification, a second surface of a semiconductor substrate of the semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to semiconductor devices, in particular to field effect semiconductor transistor. Within this specification the terms "semiconductor device" and "semiconductor component" are used synonymously. The semiconductor device is typically a MOSFET having a pn-junction forming a body diode between a drift region of the first conductivity type and a body region of the second conductivity type, for example a vertical MOSFET with a source metallization and an insulated gate electrode which are arranged on the first surface and a drain metallization which is connected to the drain region and arranged on a second surface opposite to the first surface.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and insulated from the body region and configured to form and/or control a channel region through the body region.

The term "commutating" as used in this specification intends to describe the switching of the current of a semiconductor device from a forward direction or conducting direction in which a pn-load junction, for example the pn-junction between the body region and the drift region of a MOSFET, is forwardly biased to the opposite direction or reverse direction in which the pn-load junction is reversely biased. Operating the semiconductor device with reversely biased pn-load junction is in the following also referred to as operating the semiconductor device in a blocking mode. Likewise, operating the semiconductor device with forwardly biased pn-load junction is in the following also referred to as operating the semiconductor device in a forward mode. The term "hard commutating" as used in this specification intends to describe commutating with a speed of at least about $10^{10}$ V/s, more typically with a speed of at least about $2*10^{10}$ V/s.

The terms "physical breakdown voltage" and "breakdown voltage" as used in this specification intend to describe a minimum static voltage applied across a semiconductor body of a semiconductor device so that a pn-junction of the semiconductor body and a diode-structure of the semiconductor body, for example a body diode of a MOSFET, respectively, is reversely biased and becomes conductive. The term "rated breakdown voltage" of a semiconductor device as used in this specification typically refers to its physical breakdown voltage minus a safety margin. For example, a MOSFET with a rated breakdown voltage of 600 V may have a physical breakdown voltage of up to about 650 V.

Typically, the semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously. A rated breakdown voltage of a power semiconductor device may be larger than about 400 V or even large than about 600 V.

In the context of the present specification, the terms "in Ohmic contact", "in resistive electric contact" and "in resistive electric connection" intend to describe that there is a resistive current path between respective elements or portions of a semiconductor device at least when no voltages are applied to and/or across the semiconductor device. Likewise, the terms "in low resistive electric contact" and "in low resistive electric connection" intend to describe that there is a low resistive current path between respective elements or portions of a semiconductor device at least when no voltages are applied to and/or across the semiconductor device. Within this specification the terms "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "gate electrode" intends to describe an electrode which is situated next to, and insulated from the body region by a dielectric region and configured to form and/or control a channel region through the body region. The dielectric region may be made of any suitable dielectric material such as silicon oxide, for example thermal silicon oxide, silicon nitride, siliconoxynitride or the like.

In the context of the present specification, the terms "electrode" and "metallization" intend to describe a conductive region which is made of a material with high enough electric conductivity so that the conductive region forms an equipotential region during device operation. For example, the conductive region may be made of a material with metallic or near-metallic electric conductivity such as a metal, for example wolfram, highly doped poly-silicon, a silicide or the like.

In the context of the present specification, the term "mesa" or "mesa region" intends to describe a semiconductor region between two adjacent trenches extending into the semiconductor substrate or body in a vertical cross-section.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high critical avalanche field strength, the doping of the respective semiconductor regions can be chosen higher which reduces the on-state resistance Ron in the following also referred to as on-resistance Ron.

With reference to FIG. 1, a first embodiment of a semiconductor device 100 is explained. FIG. 1 illustrates a vertical cross-section through a semiconductor body 40 of the semiconductor device 100. The semiconductor body 40 extends between a first surface 101 which has a normal direction defining a vertical direction $e_n$ and a second surface 102 which is arranged opposite to the first surface 101. In the following, the vertical cross-section is also referred to as first cross-section and cross-section, respectively. A first metallization (not shown in FIG. 1), typically forming a source metallization, is typically arranged on the first surface 101. In the exemplary embodiment, a second metallization 11, typically forming a drain metallization, is arranged on the second surface 102. Furthermore, a third metallization (also not shown in FIG. 1), typically forming a gate metallization, is typically also arranged on the first surface 101 and insulated from the first metallization and semiconductor body 40. Accordingly, the semiconductor device 100 may be operated as a three-terminal device.

The semiconductor body 40 typically includes a bulk mono-crystalline material 4 and at least one epitaxial layer $1c$, $1b$, $1a$ formed thereon. Using the epitaxial layer(s) 1 provides more freedom in tailoring the background doping of the material since the doping concentration can be adjusted during deposition of the epitaxial layer or layers.

In the exemplary embodiment illustrated in FIG. 1, the semiconductor body 40 includes a drain layer $1d$, 4, which may also be referred to as drain contact layer, extending to the second surface 102 and adjoining the drain metallization 11, an n-type drift layer $1a$ extending to the first surface 101 and an n-type buffer and field-stop layer $1b$, $1c$ which is arranged between and is in ohmic contact with the drain layer $1d$, 4 and the drift layer $1a$. A maximum doping concentration of the buffer and field-stop layer $1b$, $1c$ is typically higher than a maximum doping concentration of the drift layer $1a$ and lower than a maximum doping concentration of the drain layer 4.

Typically, the buffer and field-stop layer $1b$, $1c$ includes a buffer portion $1b$ and a field-stop portion $1c$ having a higher mean doping concentration and/or a higher maximum doping concentration than the buffer portion $1b$. The buffer portion $1b$ may have substantially the same or a higher mean doping concentration and/or maximum doping concentration than the drift layer $1a$. The buffer portion $1b$ is arranged between the field-stop portion $1c$ and the drift layer $1a$. The filed-stop portion $1c$ is arranged between the buffer portion $1b$ and the drain layer 4. Depending on the desired robustness of the semiconductor device 100, the buffer portion $1b$ may have a vertical extension in a range from about 2 μm to about 10 μm. The field-stop portion $1c$ may have a vertical extension in a range from about 2 μm to about 10 μm, for example a vertical extension of about 8 μm. *)

According to an embodiment, the semiconductor body 40 includes, in the vertical cross-section, two or more spaced apart p-type compensation regions 6, typically a plurality of compensation regions 6, each of which forms a respective first pn-junction with the drift layer $1a$ and the buffer and field-stop layer $1b$, $1c$, and is in Ohmic contact with the source metallization via a respective p-type body region 5. A maximum doping concentration of the p-type body regions 5 is typically higher than a maximum doping concentration of the p-type compensation regions 6.

In the exemplary embodiment, the p-type compensation regions 6 are formed as vertically orientated pillars. Alternatively, the p-type compensation regions 6 are formed as substantially vertically orientated strip-type parallelepipeds.

Figure 2:
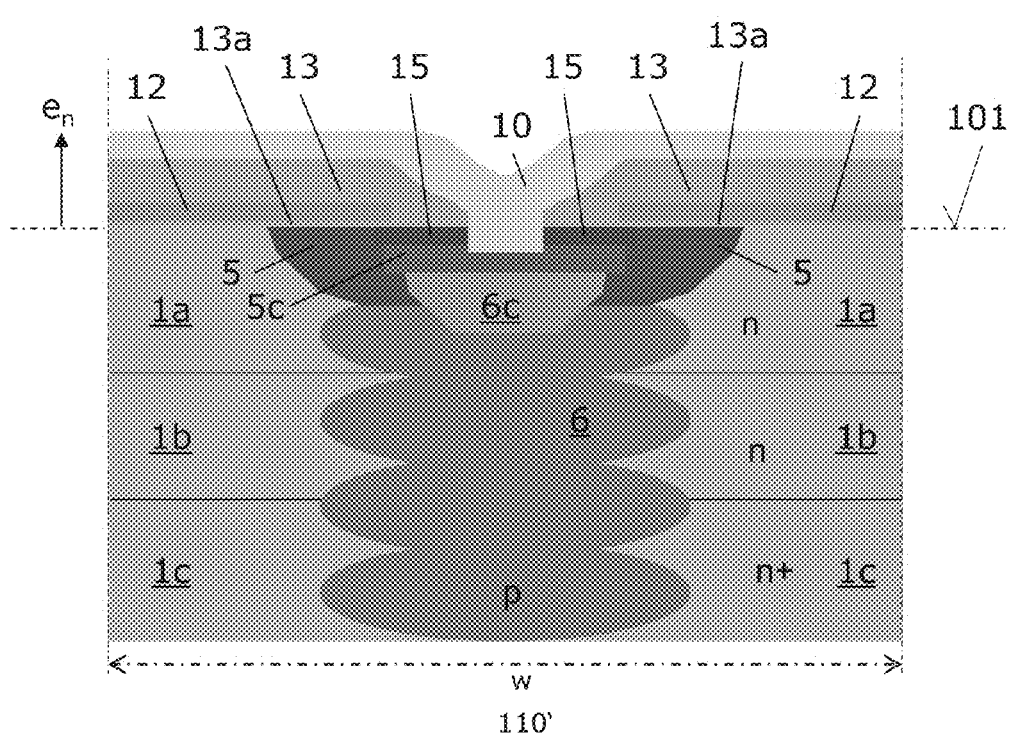
FIG. 2 illustrates a section of the vertical cross-section through the semiconductor device illustrated in FIG. 1 according to an embodiment.

That the compensation regions 6 are in low resistive electric connection with the source metallization is shown in FIG. 2 illustrating an enlarged section of the semiconductor device 100 illustrated in FIG. 1 including the structures typically formed on the first surface 101. The illustrated section of FIG. 2 typically corresponds to one of a plurality of unit cells 110', which have in the vertical cross-section a horizontal width w, and an upper part of the semiconductor device 100, respectively.

In the exemplary embodiment, a $p^+$-type body contact region $5c$ and an $n^+$-type source region 15 are formed in the body region 5. Further, a $p^+$-type contact region $6c$ extends between the body contact region $5c$ and compensation region 6. The body contact region $5c$, source region 15 and contact region $6c$ are not shown in FIG. 1 and the following Figures for sake of clarity.

A dielectric region 13 is arranged on the first surface 101. A portion $13a$ of the dielectric region 13 is arranged between the first surface 101 and the gate electrode 12 which extends in a horizontal direction from the drift region $1a$ along the body region 5 at least to the source region 15 so that an inversion channel, which is also referred to herein as a MOS-channel, may be formed by the field-effect in body region 5 along portion $13a$ forming a gate dielectric region. Accordingly, the semiconductor device 100 may be operated as a MOSFET.

The remaining portion of the dielectric region 13 forms an interlayer dielectric between a source metallization 10 and the gate electrode 12 and the first surface 101, respectively.

In the exemplary embodiment, the source metallization 10 electrically contacts the source region 15 and body contact region $5c$ (and thus the p-type compensation region 6) via a shallow trench contact formed through the interlayer dielectric 13 into the semiconductor body 40. In other embodiments, the source metallization 10 electrically contacts the source region 15 and body contact region $5c$ at the first surface 101.

According to an embodiment, the doping concentrations of the p-type compensation regions 6 and the first portions $1a$ of the drift region are chosen such that, in the off-state, their charges can be mutually depleted and that, in the on-state, an uninterrupted, low-resistive conduction path is formed from the source metallization 10 to the drain metallization 11.

According to another embodiment, the gate electrode 12 and gate dielectric $13a$ may be formed in a trench extending from the first surface 101 into the semiconductor body 40. In this embodiment, the body region 5 and the source region 15 adjoin an upper part of the trench while the drift region $1a$ adjoins a lower part of the trench. In this embodiment, the drift region $1a$ may not extend to the first surface 101 in the active area.

Referring again to FIG. 1, further embodiments are explained. Each of the compensation regions 6 includes a first portion $6a$ and a second portion $6b$. The first portion $6a$ is arranged between the respective second portion $6b$ and the source metallization 10 and the respective body region 5, respectively. The first portions $6a$ and at least a portion of the drift layer $1a$ form a substantially band-shaped first area 1 with a substantially vanishing net doping, i.e. a substantially compensated band-shaped first area 1.

Further, the second portions $6b$ and at least the buffer and field-stop layer $1b$, $1c$ form a substantially band-shaped second area 32 having an n-type net doping. In other words, the band-shaped second area 32 is only partly compensated. In the exemplary embodiment, the second area 32 is formed by the second portions $6b$, the buffer and field-stop layer $1b$, $1c$ and an adjoining portion of the drift layer $1a$.

In the exemplary embodiment, the semiconductor device 100 is a vertical semiconductor device having first area 1 and a second area 32 which are, in the vertical cross-section, substantially rectangular. In other embodiments, the source metallization 10 and the drain metallization 11 are both arranged on the main surface 101. In these embodiments, the band-shaped first area 1 and second area 32 are typically bent.

Semiconductor device 100 typically includes a plurality of pair-wise adjoining unit cells 110, 110' the definition of which is somewhat arbitrary. However, the horizontal width w of the unit cells 110, 110' is determined by the pitch w of the compensation regions 6. Independent of the exact definition and for vertical semiconductor devices, an integral obtained by integrating a concentration of p-type dopants of a rectangular second area 32 of the unit cell 110 with horizontal width w (and between lines k and l and/or between lines j and k) is typically lower than an integral obtained by integrating a concentration of n-type dopants of the second area 32, while an integral obtained by integrating a concentration of p-type dopants of a rectangular first area 1 of the unit cell 110 with horizontal width w (and between lines l and j) substantially matches an integral obtained by integrating a concentration of n-type dopants of the rectangular first area 1 of the unit cell 110.

The excess of n-type dopants of the partly compensated band-shaped second area 32 is typically in a range from about $10^{15}$ cm$^{-3}$ to about $10^{16}$ cm$^{-3}$.

Typically, the excess of n-type dopants is larger in a second portion 3 of the partly compensated band-shaped second area 32 compared to a first portion 2 of the of the band-shaped second area 32 which is arranged between the second portion 3 and the adjoining fully or at least substantially compensated portion 1 formed by the drift layer 1a and the compensation regions 6.

Typically, an effective n-doping or net n-doping of the first portion 2, i.e. an integral doping of the n-type and p-type regions 1b, 6b, is in a range from about $10^{15}$ cm$^{-3}$ to about 6*$10^{15}$ cm$^{-3}$.

In the blocking mode, in which a reverse drain-source-voltage $V_{DS}=V_D-V_S$ larger than zero is applied between the drain metallization 11 and the source metallization 10, and in which no channel regions are formed across the body regions 5, a space charge region is formed in the semiconductor body 40.

According to an embodiment, the geometry and doping relation of the semiconductor regions of the semiconductor device 100 are chosen such that the compensation regions 6 are substantially depleted while the buffer and field-stop layer 1b, 1c is only partly depleted at reverse drain-source-voltage $V_{DS}$ which are higher than about 30% of the breakdown voltage of the semiconductor device 100. This is indicated by curve c in FIG. 1 showing a boundary of the corresponding space-charge region. For comparison, a line a corresponding to a space charge region of a similar device with same n-type doping but without the partly compensated area 32 at about 30% of its breakdown voltage is additionally shown in FIG. 1.

When the reverse drain-source-voltage is further increased the partly compensated area 32 is further depleted. Accordingly, the space charge region extends further into n-type subareas 1b, 1c of the partly compensated area 32. The phrase that "a space charge region is further formed in a second area" as used within this specification intends to describe, that the one or more sub-areas of the second area which are of the second conductivity type are already substantially depleted while the one or more sub-areas of the second area which are of the first conductivity type are further depleted with increasing voltage drop. Likewise, the phrase that "a space charge region is further formed in a second portion" as used within this specification intends to describe, that the one or more sub-portions of the second portion which are of the second conductivity type are already substantially depleted while the one or more sub-portions of the second portion which are of the first conductivity type are further depleted with increasing voltage drop.

Curve d in FIG. 1 corresponds to a boundary of the space charge region at a reverse drain-source-voltage which matches the breakdown voltage of the semiconductor device 100. Without the partly compensated area 32, the boundary of the space charge region at breakdown voltage would be in a depth of about line k in FIG. 1.

In the exemplary embodiment, the drift layer and the buffer and field-stop layer 1b, 1c are, with increasing reverse drain-source-voltage, first substantially horizontally depleted at reverse drain-source-voltage below about 30% of the breakdown voltage and then substantially vertically depleted at reverse drain-source-voltage above about 30% of the breakdown voltage.

Since the space charge region (depletion layer) spreads, similar to semiconductor devices with a purely n-doped buffer layer, smoothly with increasing reverse drain-source-voltage in the vertical direction, the advantageous electrical effects of a purely n-doped buffer layer are preserved. For example, the stored holes in the buffer and field-stop layer 1b, 1c area may be removed smoothly with the voltage during commutating the semiconductor device 100. This results in a good switching softness.

Due to the compensation regions 6, which extend through the buffer layer 1b, the on-state resistance Ron of the semiconductor device 100 is reduced compared to conventional compensation devices while the output capacitance is only slightly increased. As a result a better trade-off between on-state resistance Ron and switching losses may be achieved.

Furthermore, in an avalanche mode, for example during a dynamic avalanche or a high current mode initiated by cosmic rays, the electric field can further penetrate into the field-stop layer 1c in such a way that a penetration depth of the electric field into the field-stop layer 1c increasing with the current by virtue of a voltage reserve being built up in the field-stop layer 1c. This is similar to compensation devices having a field-stop layer below the compensation structures 6 and avoids the so-called snapback effect at high current densities which may result in a collapse of the drain voltage and even device damage.

The compensation regions 6 may extend close to or even at least to an interface formed between the field-stop layer 1c and the drain layer 4. A thin substantially n-type (uncompensated) layer of the field-stop layer 1c, for example an n-type layer with a vertical thickness of 2 µm or less, may be arranged below the floating compensation regions 6. Due to the partly compensated area 32 which is at least close to the drain layer 4, the on-state resistance Ron may be lower compared to conventional compensation devices having an uncompensated field-stop layer below the completely compensated compensation structures while the snapback effect is also avoided.

Typically, at most 30% of the breakdown voltage drops across the field-stop portion 1c when the breakdown voltage is applied between the drain metallization 11 and the source metallization 10.

Figure 3:
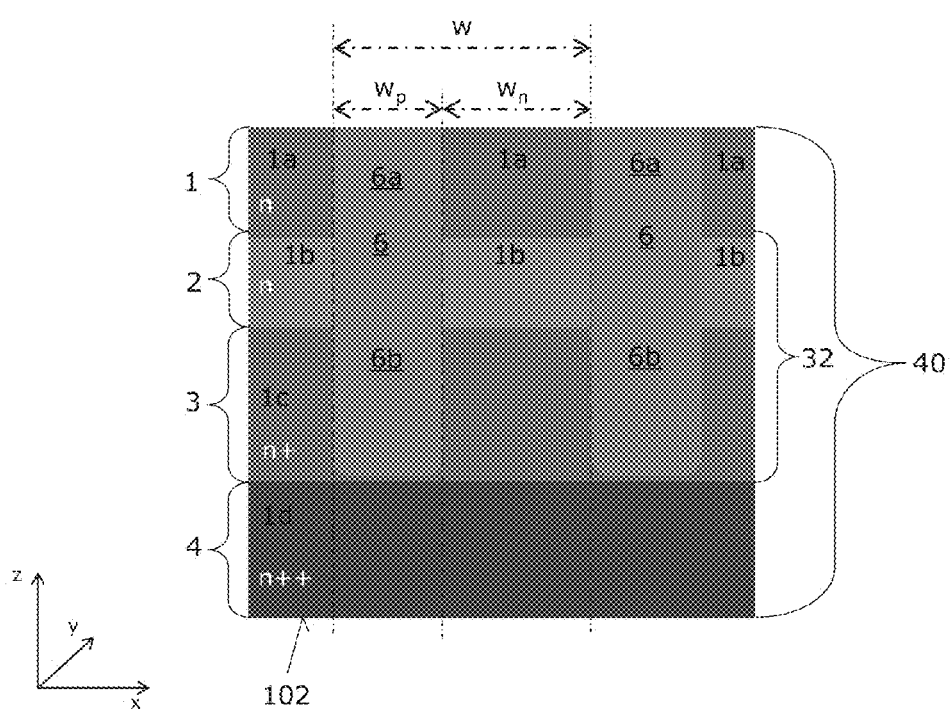
FIG. 3 illustrates a vertical cross-section through a semiconductor body of a semiconductor device according to an embodiment.

FIG. 3 illustrates a vertical cross-section through a semiconductor body 40 of a semiconductor device 100'. The semiconductor device 100' is similar to the semiconductor device 100 explained above with regard to FIGS. 1, 2. However, the p-type compensation regions 6 of the semiconductor device 100' are formed as substantially vertically orientated strip-type parallelepipeds. Accordingly, semiconductor device 100' has a compensation structure of alternating p-type columns 6 and n-columns 1a, 1b, 1c each of which has a substantially rectangular cross-section. The pitch w of the p-type compensation regions 6 (p-type columns 6) and the width w of a unit cell 110', respectively, is determined by the sum of the horizontal extension $w_p$ of the p-type columns 6 (compensation regions 6) and the horizontal distance $w_n$ between adjacent p-type columns 6 and the horizontal width $w_n$ of the n-type columns 1a, 1b, 1c, respectively, in the vertical cross-section.

According to an embodiment, the doping relations are chosen such that the horizontal component of the electric field, which is in the following also referred to as lateral electric field, in the space charge region is about $1/\sqrt{2}$ of the break-down electric field $E_{BD}$ of the semiconductor material.

Denoting the horizontal direction and the vertical direction in FIG. 3 as x-direction and z-direction, respectively, the following estimate for a typically desired doping concentration $N_{D32}(z)$ of the n-type columns 1a, 1b, 1c in the partly compensated area 32 can be made. The net p-doping is determined by the maximum allowable lateral electric field ($E_x$). The net n-doping in the partly compensated area 32 is designed such that the vertically depletable surface charge of the n-type columns matches the vertically depletable surface charge of a similar semiconductor device but with a purely n-type buffer layer of doping $N_D(z)$ beneath the p-type columns plus the horizontally depletable charge of the partly compensated area 32. This results in a doping concentration of the n-type columns 1a, 1b, 1c in the partly compensated area 32 of $N_{D32}(z)=N_D(z)*w/w_n+N_{Ap}$, where $N_{Ap}$ is the p-doping of the p-type columns 6 which is given by $N_{Ap}=\sqrt{2}*E_{BD}*\epsilon_0*\epsilon_r/(w_p*q)$ with $\epsilon_0$, $\epsilon_r$ and q referring to vacuum permittivity, relative permittivity of the semiconductor material and elementary charge, respectively.

With such a doping relation the on-state resistance Ron may be reduced by 10% or more compared to conventional compensation semiconductor devices without reducing softness and without increasing the risk of device failure in high current modes.

Figure 4:
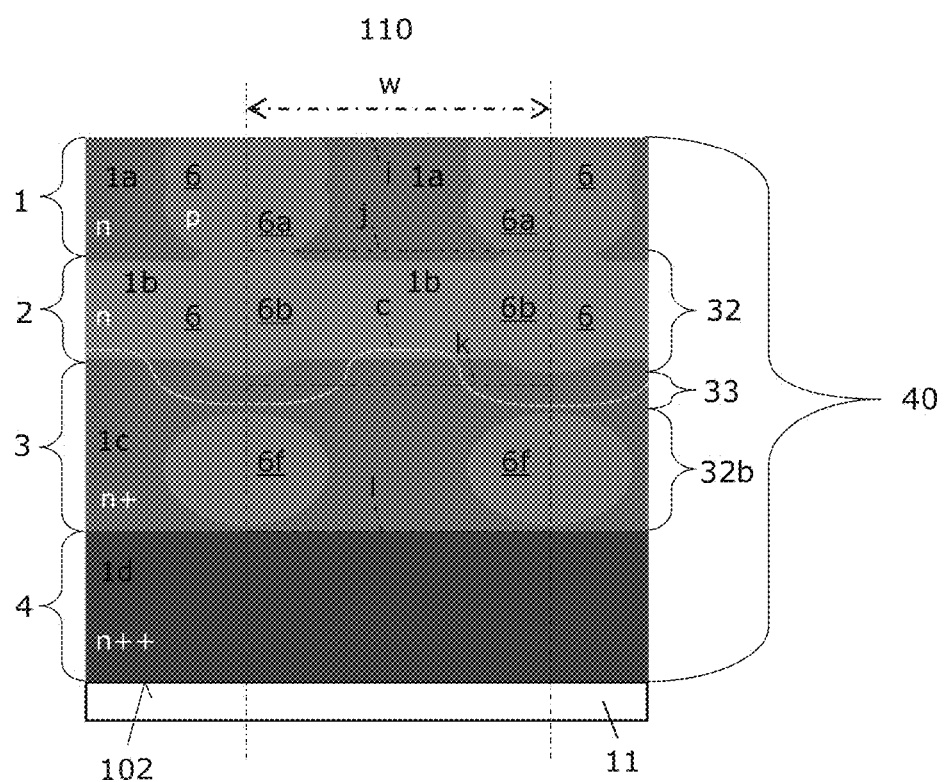
FIG. 4 illustrates a vertical cross-section through a semiconductor body of a semiconductor device according to an embodiment.

FIG. 4 illustrates a vertical cross-section through a semiconductor body 40 of a semiconductor device 200. The semiconductor device 200 is similar to the semiconductor device 100 explained above with regard to FIGS. 1, 2. The p-type second portions 6b of the compensation regions 6 also form together with the buffer layer 1b and possibly with adjoining portions of the drift layer 1a and the field-stop layer 1c a partly compensated area 32. However, the p-type compensation regions 6 of the semiconductor device 100 extend vertically only into a portion of the buffer and field-stop layer 1b, 1c which is depleted when a reverse drain-source-voltage corresponding to the breakdown voltage is applied. A boundary of the corresponding space-charge region is indicated by curve c in FIG. 4.

According to an embodiment, the p-type floating compensation regions 6f are arranged in a portion of the field-stop layer 1c which is not depleted when the breakdown voltage is applied between the drain metallization 11 and the source metallization 10. In the vertical cross-section each of the p-type floating compensation regions 6f form a closed pn-junction with the field-stop layer 1c.

In the exemplary embodiment, the floating compensation regions 6f have the same pitch as and are vertically centered with respect to the compensation regions 6. In other embodiments, the floating compensation regions 6f have a different pitch.

The net p-doping of the floating compensation regions 6f is typically lower than the net n-doping of the field-stop layer 1c. Accordingly, the field-stop layer 1c and the floating compensation regions 6f typically form a further partly compensated area 32b which is not depleted under static conditions for reverse voltages up to the breakdown voltage but may be depleted in a dynamic avalanche mode or another high current mode. The partly compensated area 32 and the further partly compensated area 32b, which are also referred to as first and second partly compensated areas 32, 32b, respectively, are separated from each other by a thin substantially n-type (uncompensated) area 33 of the field-stop layer 1c. The thin substantially n-type layer 33 has typically a vertical extension of less than about 3 µm, more typically less than about 2 µm, for example of about 1 µm.

The floating compensation regions 6f may extend at least close to an interface formed between the drain layer 1d and the field-stop layer 1c. In other embodiments, a thin substantially n-type (uncompensated) layer of the field-stop layer 1c is arranged below the floating compensation regions 6f. The thin substantially n-type layer has typically a vertical extension of less than about 3 µm, more typically less than about 2 µm.

The buffer layer 1b may have a maximum doping which is substantially equal to or higher than the maximum doping concentration of the drift layer 1a but lower than the maximum doping concentration of the field-stop layer 1c.

Since the floating compensation regions 6f are not connected to the source metallization 10, they do not contribute to the output capacitance. In the dynamic case, the floating compensation regions 6f may be completely depleted while the field-stop layer 1c is only partly depleted. During depleting, the free charge carriers flow field-driven to the source electrode and the drain electrode 11, respectively. If the transistor is switched again the floating compensation regions 6f may not be filled with holes again immediately. Thus, a corresponding space-charge region may remain for a while in adjacent regions of the field-stop layer 1c. This may result in a small temporary increase of the on-resistance Ron. Typically the temporary increase of the on-resistance Ron is not larger than the corresponding resistance of an "equivalent" pure n-doped layer. Further, thermally generated charge carriers will refill the depleted floating compensation regions 6f in subsequent operating cycles so that the on-resistance Ron is reduced again.

The semiconductor devices 100, 100', 200 explained above with regard to FIGS. 1 to 4 are typically power semiconductor devices, for example vertical power semiconductor devices, having a plurality of unit cells 110, 110'. While the drawings refer to n-channel MOSFETs, similar p-channel MOSFETs with opposite doping types of the semiconductor regions may be provided.

According to an embodiment, the power semiconductor device 100, 100', 200 includes a breakdown voltage, a source metallization 10, a drain metallization 11 and a semiconductor body 40. The semiconductor body 40 includes a main surface 101, a drift layer 1a of a first conductivity type in Ohmic contact with the drain metallization 11, a buffer and field-stop layer 1b, 1c of the first conductivity type adjoining the drift layer 1a and having a higher maximum doping concentration than the drift layer 1a, and a plurality of unit cells 110, 110'. The plurality of unit cells 110, 110' include, in a vertical cross-section which is substantially orthogonal to the main surface 101, a plurality of spaced apart compensation regions 6 of a second conductivity type each of which forms a respective first pn-junction with the drift layer 1a and the buffer and field-stop layer 1b, 1c, and is in Ohmic contact with the source metallization 10. An upper portion 1 of the unit cells 110, 110' has a substantially vanishing net doping and an adjoining lower portion 32 of the unit cells 110, 110' has a net doping of the first conductivity type. A space charge region may further be formed in sub-regions 1b, 1c of the first conductivity type of the lower portion 32 and further extend into sub-regions 1b, 1c of the first conductivity type of the lower portion 32, respectively, when a reverse voltage between about 30% and at least 70%, typically 100%, of the breakdown voltage is applied between the drain metallization 11 and the source metallization 10.

In an avalanche mode, a penetration depth of an electric field into the buffer and field-stop layer 1b, 1c typically increases with the current.

The buffer and field-stop layer 1b, 1c typically includes a buffer portion 1b (buffer layer) and a field-stop portion 1c (field-stop layer) having a higher mean doping concentration than the buffer portion 1b. The buffer portion 1b is arranged between the field-stop portion 1c and the drift layer 1a.

The buffer portion 1b may have a vertical extension in a range from about 2 μm to about 10 μm.

Typically, at most about 30% of the breakdown voltage drops across the field-stop portion 1c, when a reverse drain-source-voltage corresponding to the breakdown voltage is applied between the drain metallization 11 and the source metallization 10.

The compensation regions 6 typically extend substantially across the buffer portion 1b. The compensation regions 6 may extend at least close to a drain layer 4 as illustrated in FIGS. 1 to 3.

Alternatively, below each of the compensation regions 6 a floating compensation region 6f of the second conductivity type may be arranged, which is completely embedded in the field-stop portion 1c as illustrated in FIG. 4. A net p-doping of the floating compensation regions 6f is typically lower than a net n-doping of the field-stop portion 1c.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device having a breakdown voltage, comprising:
    a source metallization;
    a drain metallization; and
    a semiconductor body, comprising:
        a drift layer of a first conductivity type in Ohmic contact with the drain metallization;
        a buffer layer and a field-stop layer of the first conductivity type, the buffer layer adjoining the drift layer and comprising a higher maximum doping concentration than the drift layer; and
        in a vertical cross-section a plurality of spaced apart compensation regions of a second conductivity type each of which forms a respective first pn-junction with the drift layer, the buffer layer, and the field-stop layer, and is in Ohmic contact with the source metallization, each of the compensation regions comprising a second portion and a first portion arranged between the second portion and the source metallization, the first portions and the drift layer forming a substantially band-shaped first area having a substantially vanishing net doping, the second portions and at least the buffer layer and the field-stop layer forming a substantially band-shaped second area having a net doping of the first conductivity type,
    wherein a space charge region forms in the second area when a reverse voltage between about 30% and at least 70% of the breakdown voltage is applied between the drain metallization and the source metallization.

2. The semiconductor device of claim 1, wherein the field-stop layer comprises a higher mean doping concentration than the buffer layer, the buffer layer being arranged between the field-stop layer and the drift layer.

3. The semiconductor device of claim 2, wherein the semiconductor body comprises a main surface, wherein the vertical cross-section is substantially perpendicular to the main surface, and wherein the buffer layer, has, in a direction which is substantially perpendicular to the main surface, an extension in a range from about 2 μm to about 10 μm.

4. The semiconductor device of claim 2, wherein at most about 30% of the breakdown voltage drops across the field-stop layer when the breakdown voltage is applied between the drain metallization and the source metallization.

5. The semiconductor device of claim 2, wherein the field-stop layer is only partly depleted when the breakdown voltage is applied between the drain metallization and the source metallization.

6. The semiconductor device of claim 2, wherein the compensation regions extend substantially across the buffer layer, further comprising, in the vertical cross-section, a plurality of spaced apart floating compensation regions of the second conductivity type which are completely embedded in the field-stop layer and comprise a lower net doping than the field-stop layer.

7. The semiconductor device of claim 1, further comprising a drain layer of the first conductivity type which is arranged between the drain metallization and the field-stop layer and comprises a higher maximum doping concentration than the field-stop layer.

8. The semiconductor device of claim 7, wherein the drain layer and the field-stop layer form an interface, and wherein the compensation regions extend close to the interface.

9. The semiconductor device of claim 1, wherein the space charge region is formed in the first area when a reverse voltage below about 30% of the breakdown voltage is applied between the drain metallization and the source metallization.

10. The semiconductor device of claim 1, wherein the compensation regions are substantially depleted when a reverse voltage of about 30% of the breakdown voltage is applied between the drain metallization and the source metallization.

11. The semiconductor device of claim 1, wherein a net doping of a portion of the second area which adjoins the first area is in a range from about $10^{15}$ cm-3 to about $6*10^{15}$ cm-3.

12. The semiconductor device of claim 1, wherein in an avalanche mode or another high current mode a penetration depth of an electric field into the field-stop layer increases with the current.

13. The semiconductor device of claim 1, wherein at least one of the first area and the second area is substantially rectangular.

14. A semiconductor device having a breakdown voltage, comprising:
   a source metallization;
   a drain metallization; and
   a semiconductor body, comprising:
      a drift layer of a first conductivity type in Ohmic contact with the drain metallization;
      a field-stop layer of the first conductivity type arranged between the drain metallization and the drift layer, in ohmic contact with the drift layer and comprising a higher maximum doping concentration than the drift layer;
      in a vertical cross section at least two spaced apart compensation regions of a second conductivity type each of which forms a respective first pn-junction with the drift layer and is in Ohmic contact with the source metallization; and
      in the vertical cross section at least two floating compensation regions of the second conductivity type each of which forming forms a closed pn-junction with the field-stop layer and being arranged in a portion of the field-stop layer which is not depleted when the breakdown voltage is applied between the drain metallization and the source metallization.

15. The semiconductor device of claim 14, wherein a plurality of floating compensation regions are arranged in the field-stop layer and wherein a net p-doping of the plurality of floating compensation regions is lower than a net n-doping of the field-stop layer.

16. The semiconductor device of claim 14, further comprising a buffer layer of the first conductivity type arranged between the drift layer and the field-stop layer and comprising a maximum doping which is higher than the maximum doping concentration of the drift layer and lower than the maximum doping concentration of the field-stop layer, wherein the compensation regions extend into the buffer layer.

17. The semiconductor device of claim 14, wherein the semiconductor device comprises, in the vertical cross-section, a plurality of adjoining unit cells, and wherein in each of the unit cells an integral obtained by integrating a concentration of n-type dopants of a substantially rectangular first area substantially matches an integral obtained by integrating a concentration of p-type dopants of the first area, the first area being arranged next the source metallization, and a horizontal extension of the first rectangular area substantially matching a horizontal extension of the unit cell.

18. The semiconductor device of claim 17, wherein in each of the unit cells an integral obtained by integrating a concentration of p-type dopants of a substantially rectangular second area of the unit cell is different to an integral obtained by integrating a concentration of n-type dopants of the second area, the first area being arranged between the source metallization and the second area, a horizontal extension of the second rectangular area substantially matching the horizontal extension of the unit cell.

19. The semiconductor device of claim 18, further comprising a drain layer of the first conductivity type which is arranged between the drain metallization and the field-stop layer and comprises a higher maximum doping concentration than the field-stop layer.

20. The semiconductor device of claim 19, wherein the drain layer and the field-stop layer form an interface, and wherein the floating compensation regions extend close to the interface.

21. A power semiconductor device having a breakdown voltage, comprising:
   a source metallization;
   a drain metallization; and
   a semiconductor body, comprising:
      a main surface;
      a drift layer of a first conductivity type in Ohmic contact with the drain metallization;
      a buffer layer and a field-stop layer of the first conductivity type, the field stop layer adjoining the drift layer and comprising a higher maximum doping concentration than the drift layer; and
      a plurality of unit cells comprising, in a vertical cross-section which is substantially orthogonal to the main surface, a plurality of spaced apart compensation regions of a second conductivity type each of which forms a respective first pn-junction with the drift layer, the buffer and the field-stop layer, and is in Ohmic contact with the source metallization; and
   wherein an upper portion of the unit cells having a substantially vanishing net doping and an adjoining lower portion of the unit cells having a net doping of the first conductivity type, a space charge region forms in the lower portion when a reverse voltage between about 30% and at least 70% of the breakdown voltage is applied between the drain metallization and the source metallization, in an avalanche mode a penetration depth of an electric field into the field-stop layer increasing with the current.

22. The semiconductor device of claim 21, wherein the field-stop layer comprises a higher mean doping concentration than the buffer layer, the buffer layer being arranged between the field-stop layer and the drift layer.

23. The semiconductor device of claim 22, wherein the buffer layer has a vertical extension in a range from about 2 μm to about 10 μm.

24. The semiconductor device of claim 22 wherein at most about 30% of the breakdown voltage drops across the field-stop portion when the breakdown voltage is applied between the drain metallization and the source metallization.

25. The semiconductor device of claim 22, wherein the compensation regions extend substantially across the buffer portion, wherein below each of the compensation regions a floating compensation region of the second conductivity type is arranged, which is completely embedded in the field-stop portion, and wherein net-doping of the floating compensation regions is lower than a net doping of the field-stop portion.

* * * * *